(12) United States Patent
Hu et al.

(10) Patent No.: US 11,560,623 B2
(45) Date of Patent: Jan. 24, 2023

(54) METHODS OF REDUCING CHAMBER RESIDUES

(71) Applicant: Applied Materials, Inc., Santa Clara, CA (US)

(72) Inventors: Liangfa Hu, San Jose, CA (US); Prashant Kumar Kulshreshtha, San Jose, CA (US); Anjana M. Patel, San Jose, CA (US); Abdul Aziz Khaja, San Jose, CA (US); Viren Kalsekar, Sunnyvale, CA (US); Vinay K. Prabhakar, Cupertino, CA (US); Satya Teja Babu Thokachichu, San Jose, CA (US); Byung Seok Kwon, San Jose, CA (US); Ratsamee Limdulpaiboon, San Jose, CA (US); Kwangduk Douglas Lee, Redwood City, CA (US); Ganesh Balasubramanian, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 134 days.

(21) Appl. No.: 16/857,755

(22) Filed: Apr. 24, 2020

(65) Prior Publication Data
US 2020/0362457 A1   Nov. 19, 2020

Related U.S. Application Data

(60) Provisional application No. 62/848,337, filed on May 15, 2019.

(51) Int. Cl.
| C23C 16/455 | (2006.01) |
| C23C 16/505 | (2006.01) |
| C23C 16/44  | (2006.01) |

(52) U.S. Cl.
CPC ........ *C23C 16/455* (2013.01); *C23C 16/4401* (2013.01); *C23C 16/4408* (2013.01);
(Continued)

(58) Field of Classification Search
None
See application file for complete search history.

(56) References Cited

U.S. PATENT DOCUMENTS

| 6,200,412 B1 | 3/2001 | Kilgore et al. |
| 6,320,154 B1 * | 11/2001 | Akahori ............ H01J 37/32192 |
| | | 219/121.41 |

(Continued)

FOREIGN PATENT DOCUMENTS

| EP | 0933803 A1 | 8/1999 |
| EP | 2138604 B1 | 3/2013 |

(Continued)

OTHER PUBLICATIONS

See lid. (2015). In C. Schwarz, The Chambers Dictionary (13th ed.). Chambers Harrap. Credo Reference: https://search.credoreference.com/content/entry/chambdict/lid/0?institutionId=743 (Year: 2015).*

(Continued)

*Primary Examiner* — Jose I Hernandez-Kenney
(74) *Attorney, Agent, or Firm* — Patterson + Sheridan, LLP

(57) ABSTRACT

The present disclosure relates to systems and methods for reducing the formation of hardware residue and minimizing secondary plasma formation during substrate processing in a process chamber. The process chamber may include a gas distribution member configured to flow a first gas into a process volume and generate a plasma therefrom. A second gas is supplied into a lower region of the process volume. Further, an exhaust port is disposed in the lower region to (Continued)

remove excess gases or by-products from the process volume during or after processing.

16 Claims, 3 Drawing Sheets

(52) U.S. Cl.
CPC .. *C23C 16/45519* (2013.01); *C23C 16/45597* (2013.01); *C23C 16/505* (2013.01)

(56) References Cited

U.S. PATENT DOCUMENTS

| | | | |
|---|---|---|---|
| 9,653,326 B2 | 5/2017 | Noda et al. | |
| 9,659,767 B2 | 5/2017 | Yanai et al. | |
| 10,600,624 B2 | 3/2020 | Ghosh et al. | |
| 10,636,628 B2 | 4/2020 | Ghosh et al. | |
| 2007/0209590 A1* | 9/2007 | Li | C23C 16/4401 118/719 |
| 2013/0153807 A1* | 6/2013 | Balasubramanyam | F16K 15/147 251/327 |
| 2014/0083523 A1* | 3/2014 | Rocha-Alvarez | C23C 16/45565 137/334 |
| 2014/0322897 A1* | 10/2014 | Samir | C23C 16/4401 118/733 |
| 2015/0228463 A1* | 8/2015 | Manna | C23C 16/452 427/249.1 |
| 2017/0178758 A1* | 6/2017 | Ha | H01L 21/67115 |
| 2019/0122872 A1* | 4/2019 | Ghosh | C23C 16/4408 |
| 2020/0105508 A1* | 4/2020 | Belau | H01L 21/67109 |

FOREIGN PATENT DOCUMENTS

| | | |
|---|---|---|
| JP | H08260155 A | 10/1996 |
| JP | 5287592 B2 | 9/2013 |
| WO | 2017034687 A1 | 3/2017 |

OTHER PUBLICATIONS

PCT International Search Report and Written Opinion dated Aug. 14, 2020, for International Application No. PCT/US2020/029878.

* cited by examiner

METHODS OF REDUCING CHAMBER RESIDUES

CROSS-REFERENCE TO RELATED APPLICATIONS

This application claims benefit of U.S. provisional patent application Ser. No. 62/848,337, filed May 15, 2019, which is herein incorporated by reference in its entirety.

BACKGROUND

Field

Embodiments of the present disclosure generally relate to methods and apparatus for minimizing the formation of residues on chamber walls and hardware components during substrate deposition processes, such as hardware components of process chambers during deposition of thin films on semiconductor substrates.

Description of the Related Art

Plasma-enhanced chemical vapor deposition (PECVD) can be used to form one or more thin films on a substrate for semiconductor device fabrication. As semiconductor devices demand higher memory density due to their continuously decreasing dimensions and the utilization of multi-stack structures, control of film properties of the semiconductor devices is of increasing concern. A major contributor of defects in the film formation process is the presence of residues in the deposition chamber, particularly residues deposited in undesired areas such as the chamber bottom and slit valve areas. The presence of such residues in the chamber not only results in defective semiconductor devices, but also increases cleaning time between deposition cycles, thus reducing overall yield throughput and increasing manufacturing costs. Factors contributing in the buildup of chamber residues include errant dispersion of plasma throughout the chamber and the formation of undesired parasitic plasma.

Accordingly, what is needed in the art are improved methods and apparatus for minimizing the deposition and buildup of residues on chamber components.

SUMMARY

In one embodiment, a method for forming a film comprises introducing a first gas into a process volume of a process chamber at a first flow rate, generating a plasma from the first gas to form a film on a substrate disposed on a substrate support assembly, and introducing a second gas into the process volume at a second flow rate. The second gas is introduced into a lower region of the process volume via a gas introduction port disposed below the substrate support assembly. A ratio of the first flow rate to the second flow rate is between about 0.5 and about 3.

In one embodiment, a method for forming a film comprises introducing a first gas into a process volume of a process chamber at a first flow rate, generating a plasma from the first gas to form a film on a substrate disposed on a substrate support assembly, and introducing a second gas into the process volume at a second flow rate that accounts for 40% of a total flow within the process chamber. The second gas is introduced into a lower region of the process volume via a gas introduction port disposed below the substrate support assembly.

In one embodiment, a method for forming a film comprises introducing a first gas into a process volume of a process chamber at a first flow rate, generating a plasma from the first process gas to form a film on a substrate disposed on a substrate support assembly, and introducing oxygen gas into the process volume at a second flow rate that accounts for at least 40% of a total flow in the process chamber. A ratio of the first flow rate to the second flow rate is between about 0.5 and about 3. The oxygen gas is introduced into a lower region of the process volume via a gas introduction port disposed below the substrate support assembly and facilitates a spontaneous combustion reaction to consume unreacted species of the plasma below the substrate support assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to systems and methods for reducing the formation of hardware residue and minimizing secondary plasma formation during substrate processing in a process chamber. The process chamber may include a gas distribution member configured to flow a first gas into a process volume and generate a plasma therefrom. A second gas is supplied into a lower region of the process volume to reduce errant dispersion of the plasma, reduce the presence of active radical species below the wafer plane, and actively clean the lower region. Further, an exhaust port is disposed in the lower region to remove excess gases or by-products from the process volume during or after processing.

Figure 1A:
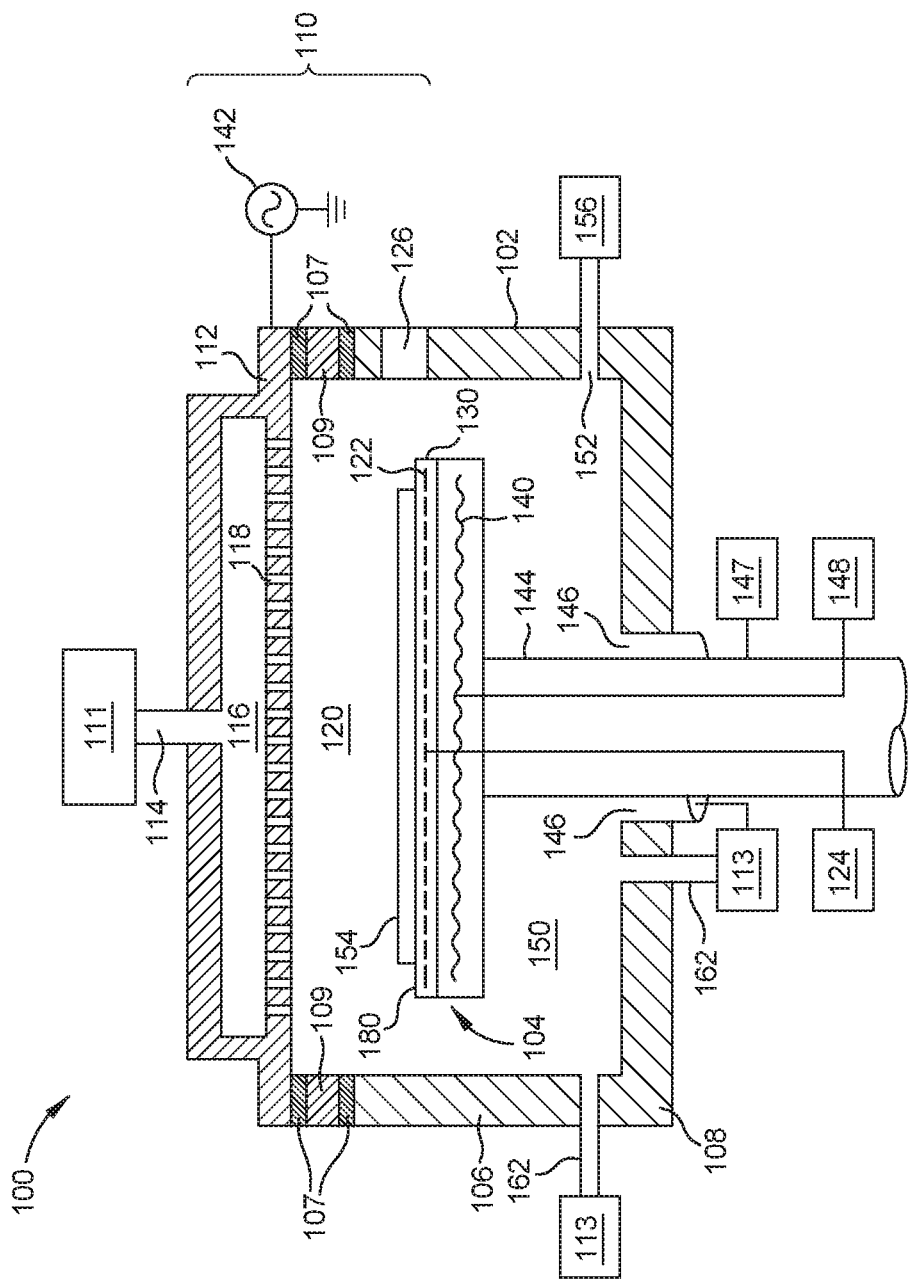
FIG. 1A illustrates a cross-sectional schematic view of an exemplary process chamber according to one embodiment of the disclosure.

FIG. 1A is a schematic cross-sectional view of a process chamber 100 according to one embodiment. The process chamber 100 may be a plasma enhanced chemical vapor deposition (PECVD) chamber suitable for depositing a chemical vapor deposition film (CVD) film on a substrate, such as substrate 154. Examples of process chambers that may be adapted to benefit as described herein include the PRODUCER® CVD process apparatus and PRECISION™ process apparatus commercially available from Applied Materials, Inc., Santa Clara, Calif. Other suitably configured process chambers, including those from other manufacturers or for other applications may also be used in accordance with the embodiments described herein. For example, embodiments described herein may be used to benefit etch chambers, ion implantation chambers, and stripping chambers, among others.

The process chamber 100 may be used for various plasma processes, including deposition and removal processes. In one aspect, the process chamber 100 is used to perform CVD using one or more precursor gases with or without radio frequency (RF) power sources. In another embodiment, the process chamber 100 is used for PECVD processes.

The process chamber includes a chamber body 102 having sidewalls 106 and a chamber bottom 108 at least partially defining a process volume 120. The process chamber 100 further includes a lid assembly 110 and a substrate support assembly 104. The substrate support assembly 104 is disposed in the process volume 120 and is configured to support a substrate 154 thereon during processing. The lid assembly 110 is coupled to the chamber body 102 at an upper end thereof, enclosing the substrate support assembly 104 within the process volume 120. The substrate 154 is transferred to the process volume 120 through a slit valve opening 126 formed in the sidewall 106. The slit valve opening 126 is selectively opened and closed to enable access to the process volume 120 by a substrate transfer robot (not shown) for substrate transfer. In some embodiments, one or more process gases and cleaning gases may be introduced into the process volume via the slit valve opening 126.

An electrode 109 is disposed adjacent to the chamber body 102 and separates the chamber body 102 from other components of the lid assembly 110. The electrode 109 may be part of the lid assembly 110, or may be a separate sidewall electrode. An isolator 107, which may be formed of a dielectric material such as a ceramic material or metal oxide material, for example aluminum oxide and/or aluminum nitride, contacts the electrode 109 and separates the electrode 109 electrically and thermally from other components of the lid assembly 110 and from the chamber body 102. In one embodiment, the electrode 109 is sandwiched between opposing isolators 107 such that the isolators 107 are in contact with the sidewalls 106 and the lid assembly 110.

The lid assembly 110 includes a gas distribution member 112 having a plurality of openings 118 for flowing one or more process gases, precursors, or cleaning gases into the process volume 120. The gases are supplied to the process chamber 100 from a first gas source 111 via a conduit 114, and the gases are flowed into a mixing plenum 116 prior to flowing into the process volume 120 via the openings 118. In one example, one or more inert gases may be flowed into the process volume 120 during deposition or cleaning processes, such as argon, nitrogen, oxygen, helium, and the like. Other suitable examples of precursor gases that may be flowed into the process volume 120 during deposition include propene, ammonia, tetraethyl orthosilicate, silane, and the like. The one or more gases are introduced into the process volume 120 at a total flow rate of between about 1000 standard cubic centimeters per minute (sccm) and about 20000 sccm, such as between about 5000 sccm and about 15000 sccm, such as about 10000 sccm.

The gas distribution member 112 is further coupled to a power source 142, such as a radio frequency (RF) power source, configured to provide a power to the gas distribution member 112. In one embodiment, a continuous or pulsed RF power is utilized to form a plasma in the process volume 120. In other embodiments, a continuous or pulsed DC power is utilized to form a plasma in the process volume 120. The power source 142 provides a power of between about 100 Watts and about 3000 Watts at a frequency between about 50 kHz and about 13.6 MHz.

In operation, the process gases or precursors are supplied to the process volume 120 from the first gas source 111 and flow through the plurality of openings 118 in the gas distribution member 112. A plasma is formed in the process volume 120 by activation of the process gases or precursors by RF power supplied by the power source 142 to the gas distribution member 112. The plasma forms films on, or etches films from, the substrate 154 that is supported by the substrate support assembly 104.

The substrate support assembly 104 is formed from a metallic or ceramic material, such as a metal oxide material, a metal nitride material, metal oxynitride material, or any combination thereof. For example, the substrate support assembly 104 is formed of an aluminum-containing material, an aluminum nitride-containing material, an aluminum oxide-containing material, or an aluminum oxynitride-containing material. The substrate support assembly 104 includes a substrate support surface 180 disposed on a first surface thereof, parallel to a second surface of the substrate support assembly 104 and facing the lid assembly 110. The substrate support surface 180 is configured to directly support the substrate 154 during processing. The substrate support assembly 104 is coupled to a lift mechanism 147 through a shaft 144, which extends through an opening 146 in the chamber bottom 108. The lift mechanism 147 enables the substrate support surface 180 to be moved vertically through the process volume 120 between a lower transfer position and one or more raised process positions.

An electrostatic chuck (ESC) 130 is disposed in the substrate support assembly 104. The electrostatic chuck 130 includes one or more electrodes 122. The electrodes may be a plate, a perforated plate, a mesh, a wire screen, or any other distributed arrangement. The one or more electrodes 122 are coupled to an electrode power source 124 to provide power to the electrodes 122 and facilitate chucking of the substrate 154 to the substrate support surface 180 during processing of the substrate 154. In one embodiment, the electrode power source 124 applies a DC voltage to the electrodes 122 for chucking. The electrode power source 124 is capable of producing either or both of continuous or pulsed power.

In some embodiments which can be combined with other embodiments, the substrate support assembly 104 includes additional electrodes (not shown) for use in combination with the electrode 109 to generate plasma during the processing of the substrate 154. The use of the electrode 109 and the additional electrodes disposed in either the substrate support assembly 104 or proximate the substrate support assembly 104 to generate plasma may have a variety of embodiments. For example, an RF field may be created by driving at least one of the electrode 109 and the additional electrodes with drive signals to facilitate formation of a capacitive plasma within the process volume 120. In one embodiment, the additional electrodes are used in combination with the electrode 109 to bias the plasma in the process volume 120. The electrode power source 124 provides an RF power to the electrodes 122 or additional electrodes of up to about 1000 W at a frequency of about 13.56 MHz. However, it is contemplated that other frequencies and powers may be provided depending on the application. For example, the electrode power source 124 may provide multiple frequencies, such as 13.56 MHz and 2 MHz.

The substrate support assembly 104 further includes a heater apparatus 140 disposed therein and coupled to a heater power source 148. The heater apparatus 140 is used to heat the substrate 154 and may incidentally heat the process volume 120 during the processing of the substrate 154. In one embodiment, the heater apparatus 140 is a resistive heater. In another embodiment, the heater apparatus 140 is a channel adapted to receive a flow of heated or cooled fluid, such as air, nitrogen, helium, water, glycol, or the like, therethrough to conduct heat to the substrate 154.

One or more gas introduction ports 162 are disposed through the chamber body 102 below the substrate support assembly 104 and are coupled to a second gas source 113. In one embodiment, the one or more gas introduction ports 162 are formed through the sidewalls 106 adjacent to a lower region 150 of the process volume 120. In another embodiment, the one or more gas introduction ports 162 are formed through the chamber bottom 108 separate from the opening 146, as depicted in FIG. 1A. In yet another embodiment, the opening 146 itself functions as a gas introduction port that may be utilized alternatively to or in combination with the one or more gas introduction ports 162.

The second gas source 113 supplies one or more process gases, precursors, cleaning gases, or barrier gases into a lower region 150 of the process volume 120 through the gas introduction ports 162 and/or opening 146. Alternatively or additionally, one or more gases may be supplied into the lower region 150 via the slit valve opening 126. The second gas source 113 controls the type of gas and the flow rate of the gas into the process volume 120, and more specifically, to the lower region 150. In one embodiment, the second gas source 113 supplies a purge gas into the lower region 150. The purge gas may be an inert gas. Additionally, the purge gas may be formed of a species having relatively low reactivity (e.g., a non-reactive species) relative to the gases supplied by the first gas source 111 and having a dissociation energy greater than that of diatomic argon. For example, the purge gas may be formed of a species having a dissociation energy greater than about 4.73 kJ For example, the purge gas may be formed of any one of helium, argon, oxygen, nitrogen, hydrogen, ammonia, or any combination thereof. In such an example, ionization of the second gas in the lower region 150 is mitigated or prevented.

An exhaust port 152 is in fluid communication with the process volume 120 and extends through the chamber body 102. In one embodiment, the exhaust port 152 is disposed through a sidewall 106. It is contemplated that the exhaust port 152 may be an annular pumping channel surrounding the process volume 120, or a non-annular pumping port adjacent the process volume 120. In another embodiment, the exhaust port 152 is disposed through the chamber bottom 108. The exhaust port 152 is coupled to a vacuum pump 156 to remove excess process gases or by-products from the process volume 120 during or after processing of the substrate 154.

In operation, process gases or purge gases are supplied to a lower region 150 below the substrate support assembly 104 from the second gas source 113 via the gas introduction ports 162, the opening 146, and/or the slit valve opening 126. The process gases or purge gases are supplied to the lower region 150 by the second gas source 113 while a plasma is formed above the substrate support assembly 104 to deposit one or more films on the substrate 154. Thus, the first gas source 111 and the second gas source 113 simultaneously supply gases to the process volume 120, albeit from different regions of the process chamber 100.

In certain embodiments which can be combined with other embodiments, the gas species supplied by the second gas source 113 react with the activated plasma species to form byproducts that are exhausted through the exhaust port 152. This may occur, for example, if the activated plasma species diffuses into the lower region 150, or if the second gas diffuses into an upper region of the process region 150. In certain embodiments, the gas species supplied by the second gas source 113 has no (or minimal) reactivity with the activated plasma species, but rather dilutes the activated plasma species in the process volume 120 (or in the lower region 150) before being exhausted through the exhaust port 152. In such an example, the dilution mitigates unwanted deposition in the lower region 150.

Figure 1B:
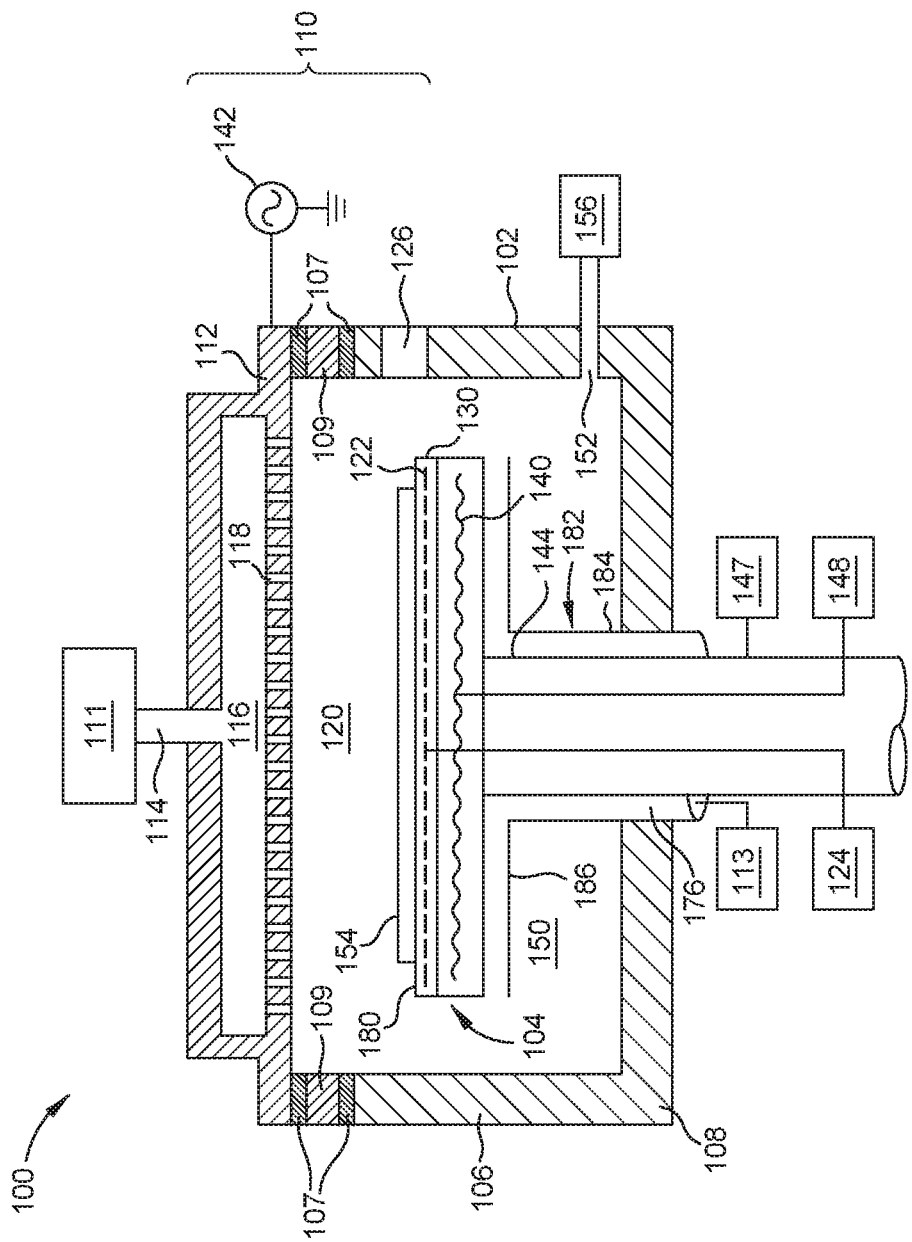
FIG. 1B illustrates a cross-sectional schematic view of an exemplary process chamber according to one embodiment of the disclosure.

FIG. 1B is a schematic cross-sectional view of the process chamber 100 according to another embodiment. The process chamber 100 depicted in FIG. 1B is substantially similar to the embodiments described above but further includes a radiation shield 182 disposed below the substrate support assembly 104. The radiation shield 182 is utilized to modulate radiation heat loss at a bottom surface of the substrate support assembly 104 to compensate for any temperature non-uniformities of the substrate support assembly 104, and thus, a substrate 154 positioned thereon.

The radiation shield 182 includes a radiation shaft 184 and a radiation plate 186. The radiation shaft 184 is a tubular or cylindrical member surrounding the shaft 144. A space 176 is formed between the radiation shaft 184 and the shaft 144 through which one or more gases supplied from the second gas source 113 may be flowed. The radiation shaft 184 further supports the radiation plate 186 and is formed of any suitable material for substrate processing, such as a quartz material.

The radiation plate 186 is a planar and disc-shaped plate that has substantially similar lateral dimensions to the substrate support assembly 104. For example, the radiation plate 186 has a diameter that is substantially similar to a diameter of the substrate support assembly 104. The radiation plate includes a central hole through which the shaft 144 extends. The radiation plate 186 may further include one or more holes disposed radially outward of the shaft 144 to enable lift pins (not shown) to actuate therethrough. In one embodiment, the radiation plate 186 is formed of an aluminum oxide or aluminum nitride material.

In operation, the radiation shield 182 may direct one or more gases supplied from the second gas source 113 through the space 176, along the bottom surface of the substrate support assembly 104, and towards the sidewalls 106. For example, the radiation shield 182 may control the flow of the one or more gases such that the gases flow radially outward along the bottom surface of the substrate support assembly 104 and towards the sidewalls 106 in a flow path substantially parallel to the substrate support assembly 104. Thus, the radially outward flowing gases may form a gas curtain between the lower region 150 and the remainder of the process volume 120 that is substantially parallel to the substrate support assembly 104. The radiation shield 182 may be used alternatively to or in combination with the gas introduction ports 162 and/or the slit valve opening 126 to introduce gases into the process volume 120, such as the lower region 150.

Figure 2:
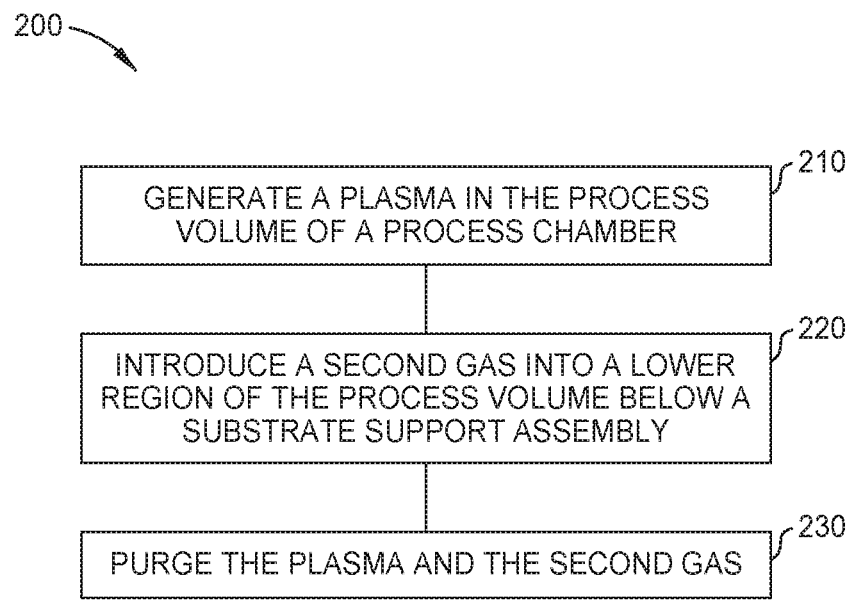
FIG. 2 illustrates a flow diagram of a method according to one embodiment described herein.

As discussed herein, film deposition operations can include the formation of one or more films on the substrate 154 positioned on the substrate support assembly 104. FIG. 2 illustrates a flow chart of a method 200 for processing a substrate, according to one or more embodiments. The method 200 may be employed to form one or more films on the substrate 154.

At operation 210, a plasma is generated in the process volume 120 of the process chamber 100. For example, a first gas is introduced from the first gas source 111 to the process volume 120 via the conduit 114. The first gas is introduced into the process volume at a flow rate of between about 1000 sccm and about 20000 sccm, such as between about 8000 sccm and about 12000 sccm. The first gas includes at least a process gas, a precursor gas, an ionizable gas, or a carrier gas, which are activated in the process volume 120 to form the plasma. For example, the power source 142 provides an RF power, such as a continuous or pulsed RF power, to the gas distribution member 112 to activate the first gas into a plasma. Further, the first gas is utilized to form a film on the substrate 154 in the presence of the plasma.

At operation 220, a second gas is introduced into the lower region 150 below the substrate support assembly 104 as plasma is generated above the substrate support assembly 104. For example, the second gas is introduced into the lower region 150 from the second gas source 113 through one or more gas introduction ports 162 formed in the sidewalls 106 and/or the chamber bottom 108. In another example, the second gas is introduced into the lower region 150 through the opening 146 between the shaft 144 and the chamber bottom 108. In yet another example, the second gas is introduced into the lower region 150 through the space 176 between the radiation shaft 184 and the shaft 144. The second gas is a non-reactive gas or a gas having a relatively low reactivity and may be formed of a species having a dissociation energy greater than that of diatomic argon. For example, the second gas is oxygen. Alternatively or additionally, the second gas may be any one of hydrogen, helium, argon, or ammonia, among others.

The second gas may be simultaneously introduced into the process volume 120 along with the first gas and function as a barrier curtain, reducing the amount of errant dispersion of the plasma and unreacted species throughout the process chamber 100, and particularly into the lower region 150. For example, the second gas, such as argon or nitrogen, functions as a dispersion trap, localizing the plasma and unreacted species above the substrate support assembly 104 and reducing diffusion (e.g., migration) elsewhere. The reduction of errant dispersion, in turn, reduces the formation of residues on chamber components, such as those components in the lower region 150 (e.g., below the substrate support assembly 104). In certain embodiments, the low reactivity of the second gas enables the second gas to function as trap without interacting or mixing with the plasma. Furthermore, the low reactivity of the second gas facilitates the reduction of active plasma species present in the lower region 150, thus reducing deposition of chamber residues formed by parasitic plasma below the substrate support assembly 104.

In another capacity, the second gas may function as a purge or cleaning gas, aiding in the removal of excess process gases or by-products from the process volume 120 during or after processing via the exhaust port 152. For example, the second gas may facilitate spontaneous combustion of unreacted process gases that migrate below the substrate support assembly 104. For example, in embodiments wherein oxygen is utilized as the second gas, the oxygen gas may facilitate a spontaneous combustion reaction consuming unreacted hydrocarbons, such as $C_3H_6$, dispersed below the substrate support assembly 104, resulting in $CO_2$ and $H_2O$ gases which can then be removed via the exhaust port 152. Thus, the second gas may actively clean the lower region of the process volume 120 as films are simultaneously deposited on the substrate 154 above.

In certain embodiments which can be combined with other embodiments, the second gas is provided to the lower processing region 150 to actively induce a reaction between the second gas and any of the first gas (e.g., the activated species) in the lower processing region 150, while simultaneously providing a barrier for entry of the first gas into the lower region 150. The first gas and the second gas may react to form a gaseous byproduct which is exhausted from the process chamber 100, mitigating or avoiding deposition of material in the lower region 150 of the process volume 120. In such an example, the second gas may be a reactive gas (e.g., a gas which reacts with the excess precursor material). For example, the first gas process may be a hydrocarbon while the second gas is oxygen or ozone. In such an example, the reaction between the first gas and the second gas is a combustion reaction. The combustion reaction may occur in the lower processing region 150. In one example, the combustion reaction does not occur, or minimally occurs, in the process volume 120 above the substrate 154.

The flow rate and type of second gas may be based on the flow rate of the first gas, the species of the first gas, the amount of plasma to be generated, the characteristics of the deposited film, the amount of first gas to be reacted with the second gas, and/or the amount of plasma dispersion to be prevented. For example, the second gas is flowed into the process volume 120 such that the second gas accounts for greater than about 25% of the total gas flow in the process volume 120 to dilute the first gas. For example, the second gas accounts for greater than about 30% of the total flow in the process volume 120, such as about 40% of the total flow. In certain embodiments, the flow rate of the second gas is determined based on the concentration of the second gas species in the deposited film (e.g., nitrogen or oxygen). In some embodiments, the flow rate of the second gas is different than the flow rate of the first gas. For example, a ratio of the flow rate of the first gas to a flow rate of the second gas is between about 0.5 and about 3. For example, a ratio of the flow rate of the first gas to a flow rate of the second gas is between about 1 and about 2. In one embodiment, the second gas is flowed into the process volume 120 at a flow rate between about 50 standard cubic centimeters per minute and about 5000 sccm, such as between about 500 sccm and about 4000 sccm. For example, the second gas is flowed into the process volume 120 at a flow rate between about 1000 sccm and about 3000 sccm, such as about 2000 sccm.

At operation 230, the plasma and the second gas are exhausted from the process chamber 100 through the exhaust port 152. For example, the exhaust port 152 may be coupled to the vacuum pump 156, and the vacuum pump 156 may remove excess process gases or by-products from the process volume 120 during or after processing of the substrate 154.

Utilizing the systems and methods described above provides numerous improvements in substrate processing operations. In particular, the methods described above provide a proactive approach to reducing or eliminating the undesired formation and buildup of residues on process chamber components by reducing the errant dispersion of plasma and active plasma species below the substrate support. As such, the occurrence of defects in films formed by plasma processes and the cleaning time between plasma processing operations is reduced, resulting in improved overall yield throughput and decreased manufacturing costs. Methods disclosed herein are particularly advantageous in the deposition of carbon or carbon-based hardmasks. Methods herein provide multiple advantages for reducing unwanted deposition, including providing a gas barrier for mitigating activated precursors species in the lower region of the process chamber at the gas/activated species interface at the substrate support plane. Additionally, methods herein facilitate unwanted deposition by inducing combustion reactions. Moreover, methods herein facilitate unwanted deposition by diluting reactive species in the lower region of the process chamber.

While the foregoing is directed to embodiments of the present disclosure, other and further embodiments of the disclosure may be devised without departing from the basic scope thereof, and the scope thereof is determined by the claims that follow.

What is claimed is:

1. A method for forming a film, the method comprising:
   transferring a substrate into a process volume of a process chamber through a slit valve opening of the process chamber, the substrate transferred onto a substrate support assembly;
   introducing a first gas into the process volume of the process chamber through a lid assembly of the process chamber at a first flow rate, the lid assembly comprising a gas distribution member having a plurality of openings;
   generating a plasma from the first gas to form a film on the substrate disposed on the substrate support assembly; and
   introducing a second gas into the process volume at a second flow rate, the second gas introduced into a lower region of the process volume via a gas introduction port separate from the slit valve opening, the gas introduction port disposed in a sidewall of the process chamber and below the substrate support assembly, the second gas introduced into the process volume simultaneously with the first gas, wherein a ratio of the first flow rate to the second flow rate is between about 0.5 and about 3.

2. The method of claim 1, wherein the second gas does not react with the plasma.

3. The method of claim 1, wherein the second gas is formed of a species having a dissociation energy equal to or greater than that of diatomic argon.

4. The method of claim 3, wherein the second gas is selected from the group consisting of argon, ammonia, helium, hydrogen, and oxygen.

5. The method of claim 1, wherein the second gas provides a barrier for preventing dispersion of the plasma below the substrate support assembly.

6. The method of claim 1, wherein the second gas reacts with the first gas in the lower region of the process volume to form a reaction byproduct, and the reaction byproduct is exhausted from the process chamber.

7. The method of claim 6, wherein introducing the first gas into the process volume of the process chamber and generating a plasma from the first gas causes dispersion of unreacted $C_3H_6$ below the substrate support assembly, and wherein the second gas facilitates a spontaneous combustion reaction to consume the unreacted $C_3H_6$ dispersed below the substrate support assembly.

8. The method of claim 1, wherein the second gas accounts for greater than 25% of a total gas flow in the process volume.

9. The method of claim 1, wherein the second gas is flowed into the process volume at a flow rate between about 500 sccm and about 4000 sccm.

10. A method for forming a film, the method comprising:
    transferring a substrate into a process volume of a process chamber through a slit valve opening of the process chamber, the substrate transferred onto a substrate support assembly disposed through a first opening in a chamber bottom of the process chamber;
    introducing a first gas into the process volume of the process chamber through a lid assembly of the process chamber at a first flow rate, the lid assembly comprising a gas distribution member having a plurality of openings;
    generating a plasma from the first gas to form a film on the substrate disposed on the substrate support assembly; and
    introducing a second gas into the process volume at a second flow rate, the second gas introduced into a lower region of the process volume via an opening in a sidewall of the process chamber and from a space between the substrate support assembly and a radiation shield disposed below the substrate support assembly, the second gas introduced into the process volume simultaneously with the first gas, wherein the second flow rate accounts for about 40% of a total flow in the process chamber.

11. The method of claim 10, wherein the second gas is a non-reactive gas having a dissociation energy equal to or greater than 4.73 $kJ^{mol-1}$.

12. The method of claim 11, wherein the second gas is selected from the group consisting of argon, ammonia, helium, hydrogen, and oxygen.

13. The method of claim 10, wherein the second gas is also introduced into the process volume from a second opening in the chamber bottom.

14. The method of claim 10, wherein a ratio of a flow rate of the first gas to a flow rate of the second gas is between about 1 and about 2.

15. The method of claim 10, wherein introducing the first gas into the process volume of the process chamber and generating a plasma from the first gas causes dispersion of unreacted $C_3H_6$ below the substrate support assembly, and wherein the second gas facilitates a spontaneous combustion reaction to consume unreacted $C_3H_6$ dispersed below the substrate support assembly.

16. A method for forming a film, the method comprising:
    transferring a substrate into a process volume of a process chamber through a slit valve opening of the process chamber, the substrate transferred onto a substrate support assembly;
    introducing a first process gas into the process volume of the process chamber through a lid assembly of the process chamber at a first flow rate, the lid assembly comprising a gas distribution member having a plurality of openings;
    generating a plasma from the first gas to form a film on the substrate disposed on the substrate support assembly;
    introducing oxygen into the process volume at a second flow rate, the oxygen introduced into a lower region of the process volume via an opening in a sidewall of the process chamber and from a space between the substrate support assembly and a radiation shield disposed below the substrate support assembly, the oxygen introduced into the process volume simultaneously with the first process gas, wherein a ratio of the first flow rate to the second flow rate is between about 0.5 and about 3, the second flow rate accounting for at least 40% of a total flow in the process chamber, the oxygen facilitating a spontaneous combustion reaction to consume unreacted $C_3H_6$ species of the plasma below the substrate support assembly; and
    exhausting the process volume via an annular pumping channel of the process chamber.

* * * * *